United States Patent [19]

Allner

[11] 3,714,584

[45] Jan. 30, 1973

[54] CIRCUIT ARRANGEMENT WITH CAPACITY DIODE TUNING FOR DISPLAYING TUNING FREQUENCIES

[76] Inventor: Olaf Allner, 1 Berlin 36 Dresdner Str. 12, Berlin, Germany

[22] Filed: Feb. 16, 1971

[21] Appl. No.: 115,382

[30] Foreign Application Priority Data

Feb. 19, 1970 Germany....................P 20 08 550.1

[52] U.S. Cl. ..................325/455, 325/422, 329/179, 331/64, 334/15, 334/16, 334/86, 340/202

[51] Int. Cl. ..............................................H04b 1/06

[58] Field of Search........325/455, 17, 346, 422, 457, 325/468; 334/30, 31, 86, 14-16; 331/64; 324/81, 98; 329/111, 179; 334/14-16; 340/202

[56] References Cited

UNITED STATES PATENTS 2,523,106 9/1950 Fairbairn et al.......................334/30

3,526,838 9/1970 Banick .................................334/31

*Primary Examiner*—Albert J. Mayer

[57] ABSTRACT

In a high frequency receiver circuit arrangement with capacity diode tuning for displaying tuning frequency, in particular for radio and television receivers, having capacity diode tuning the receiver oscillator circuit including a capacity diode is connected via a R-C-network and subsequent rectifying means oppositely directed to the terminals of a potentiometer resistor. Thereby this potentiometer is supplied with a dc voltage dependent on the frequency of the received oscillations. Its tap is connected electrically via a dc amplifier back to said capacity diode of the oscillator circuit. Besides the tap is connected mechanically to the pointer of the display on the tuning scale of the receiver, By adjusting the pointer on the tuning scale a precise tuning of the receiver by means of the capacity diode of the oscillator circuit is attained, since receiver tuning knob, pointer, and tap of the potentiometer is mechanically connected, for instance by means of a pulley drive system.

2 Claims, 2 Drawing Figures

Figure 1:
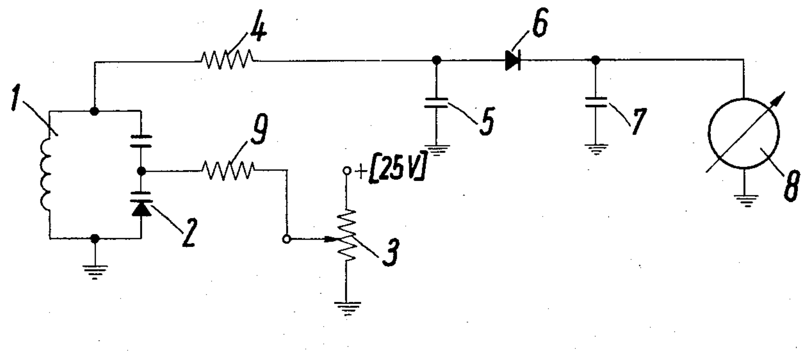

Inventor :

CIRCUIT ARRANGEMENT WITH CAPACITY DIODE TUNING FOR DISPLAYING TUNING FREQUENCIES

The invention relates to a circuit arrangement with capacity diode tuning for displaying tuning frequencies intended for use with high frequency receivers with capacity diode tuning, in particular radio and television receiver sets, and is intended to overcome difficulties which were in the past encountered in connection with efforts to achieve precise display of stations on the associated tuning scale of the set and which in particular can be traced back to the spread in the characteristics of the individual diodes. The circuit arrangement in accordance with the invention permits mass production of radio sets with AM capacity diode tuning with a reading accuracy on the scale amounting to a maximum of ± 3 percent of the length of the scale, a value which is considered adequate for series manufacture of radio sets of such types.

Known devices of this type have employed the following means to overcome the difficulties mentioned:

1. Potentiometers with resistance characteristics adjustable by means of several tappings and connected trimming potentiometers so that the characteristics of the diode and the control can be trimmed to coincide at least at several points.
2. Use of groups of diodes and potentiometers sorted in accordance with the nature of the characteristics.
3. Use of various scale types with different calibrations.

However none of the above solutions is suitable for rational manufacturing processes.

In comparison, a better solution of this problem of achieving exact display of the tuning frequency in the case of capacity diode tuning has already been proposed which consists in a method whereby the potentiometer for adjusting the frequency (tuning) is still employed but is not mechanically connected to the pointer of the display scale. The frequency in this case is displayed by what is termed a direct-display frequency measuring instrument. The principle of this method is represented as an example in FIG. 1. Since this circuit layout requires a moving coil measuring instrument for displaying frequency with a reading accuracy of at least 2.5, percent it is too expensive for rational manufacture of radio or television sets so that this method is likewise excluded if rational manufacture of radio and television sets is required.

According to the invention, the circuit arrangement with capacity diode tuning for displaying the tuning frequency comprises a receiver oscillator circuit including a capacity tuning diode, an R-C-network, a pair of rectifiers, a potentiometer resistor, a pointer for indicating the tuning frequency on a tuning scale, and a d.c.-amplifier , said R-C-network consisting of two parallel-connected branches conducted to minus pole, each of said branches being a series connection of a resistor and a capacitor on one side and of a capacitor and a resistor on the other side, the output of said oscillator circuit with said capacity tuning diode being connected electrically via said R-C-network and via said rectifiers, each connected in opposite sense, to both terminals of said potentiometer resistor in such a manner that the connection points of said resistors and said capacitors of said series connections are each connected to one of said rectifiers, the tap of said potentiometer resistor being connected electrically via said dc-amplifier back to said oscillator circuit and further mechanically to said pointer thus enabling adjusting said pointer on the tuning scale and simultaneously said potentiometer tap in accordance with the frequency value of the capacity diode system of said oscillator circuit.

The advantage of such a circuit arrangement lies in the fact that the tuning frequency reading is independent of the equipment voltage itself and no stabilization of the DC voltage of the set is required. DC voltage fluctuations of ± 15 percent are not noticed with a circuit in accordance with the invention.

The DC amplifier in series with the potentiometer tapoff preferably takes the form of a differential amplifier, which is particularly stable against external influences, e.g., supply voltage fluctuations and temperature influences.

The circuit arrangement in accordance with the invention will be described in more detail below on the basis of an exemplary embodiment shown in the drawings. Therein FIG. 1 represents the principle of a conventional circuit with direct frequency display by means of a frequency measuring instrument; and FIG. 2 shows the circuit in accordance with the invention.

With reference to FIG. 1 the oscillator circuit of the receiver set with the capacity tuning diode 2 is shown at 1. Said circuit is tuned by means of the potentiometer 3 from which a variable DC voltage is applied to the capacity tuning diode 2 via resistor 9 thus permitting the required tuning of the oscillator circuit 1 to be carried out. Circuit 1 is simultaneously connected to a direct display frequency measuring instrument 8 via an RC-network 4,5, a rectifier 6 and an inserted charging capacitor 7. This frequency measuring instrument must have a reading accuracy of at least 2.5 percent in order to guarantee a tuning setting which is adequate as regards the accuracy, a necessity which for reasons of cost does not appear justifiable for rational production of radio sets. In addition the circuit with the resistor 9 which supplies the DC voltage to the capacity tuning diode 2 for the tuning setting must be provided with an efficient DC voltage stabilization system and efficient temperature compensation which likewise leads to considerable cost increases. For these reasons this known circuit is disadvantageous for practical usage and in particular for mass production of high frequency receivers.

Figure 2:
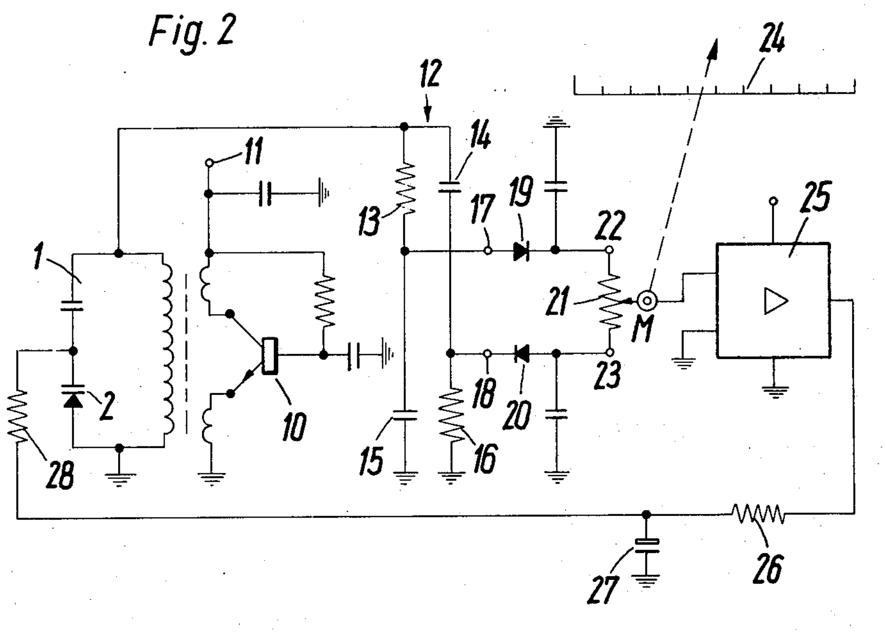

The circuit arrangement designed in accordance with the present invention is represented in FIG. 2 and avoids the above mentioned disadvantages. The oscillator circuit 1 with the capacity diode 2 together with the transistor 10 forms, in a known manner, the oscillator stage of the receiver which, also in a known manner, receives its operational voltage from terminal 11. The oscillator circuit 1 with the capacity tuning diode 2 supplies part of its high frequency voltage to an RC-network 12 consisting of the resistors 13, 16 and the capacitors 14, 15 connected in the form of a bridge. The network 12 possesses two outputs 17, 18 which, depending on the frequency of the oscillator, produce high frequency voltages of varying levels.

A high-level high frequency voltage at point 18 and a low-level high frequency voltage at point 17 corresponds with a high frequency of the oscillator 1. The reverse situation occurs when a low-level high frequency is present in the oscillator circuit 1 which corresponds to a low-level high frequency voltage at point 18 and a high-level high frequency voltage at point 17. (The voltages are measured against earth). The high frequency voltages are rectified by the diodes 19, 20 and the DC voltage obtained in this manner are fed to the potentiometer 21 which possesses a linear resistance characteristic.

In this circuit, for example at medium frequency in the oscillator circuit 1, the positive and negative voltages at terminals 22 and 23 of the potentiometer 21 are equal so that at the slide tap-off of the potentiometer i.e., at the corresponding rotation point M of the control (central position of the slider) the voltage is equal to zero. If the frequency changes in the upward or downward direction, then positive or negative DC voltages will arise on the other hand at the connection point M proportional to the magnitude of the frequency change. If the intention is now to ensure that, at any deviation of the frequency of the oscillator from the central frequency at point M, the voltage returns to zero, then the slider of the control 21 would have to be shifted from its central position by a specific amount depending on the magnitude of the frequency deviation. Thus (with zero matching of point M), the frequency with which the oscillator is resonating at the particular time could be read off directly from the angular setting of the control 21. If the rotary point M of the control is connected mechanically with the pointer of the display scale 24 of the receiver, then the particular tuning position could be read off from this display scale.

Point M is furthermore connected to the input of a DC differential amplifier 25. The voltage amplification of this amplifier must be relatively high and should amount to at least 60 db. On the output side this amplifier 25 is connected with the capacity diode 2 incorporated in the oscillator circuit 1, via the RC network 26, 27 and a series resistor 28.

This circuit functions in the following manner: If the control, i.e., the rotary knob of the control 21 at point M, which is connected mechanically with the pointer on the scale 24 and with the tuning knob of the radio set, is caused to leave its normal position (zero voltage) then a DC voltage arises at point M. This voltage is increased for example by a factor of 1,000 in the differential amplifier 25 and charges the capacitor 27 until the voltage change on the capacity diode 2 has changed the frequency of the oscillator circuit 1 to such an extent that point M again possesses a potential of approximately zero.

This process can be carried out by means of the tuning knob of the set since the tuning knob of the set, the pointer on the scale 24 and the tap-off M of the control 21 are for example connected together by means of a pulley system. The tuning knob of the instrument is thus set to the required frequency which can be determined by the pointer on the scale 24.

The setting of the control is at the same time varied by a certain amount and causes a specific DC voltage to arise at point M. This voltage is amplified by the amplifier 25, is then fed to the capacity tuning diode 2 in the oscillator circuit 1 and thereafter changes the frequency of the latter to the required value set on the scale, while point M after completion of this control procedure again lies at a potential of approximately zero, the charging or discharging process of capacitor 27 also being completed simultaneously.

A potential amounting to exactly zero is only present at point M at the central frequency, i.e., when the tapoff of the potentiometer is in the central position. At maximum deviation from the central frequency towards the upper or lower limiting frequencies, the residual voltage arising at point M is produced as follows:

If for example the central frequency changes from 1 MHz to 1.5 MHz then this will correspond with a voltage change of for example 5 V at the capacity diode 2 (depending on the characteristic). A voltage change of 5 V at the output of the amplifier 25 corresponds with a voltage change at the input of the same of 5/1000 = 5 mV. Since however when the oscillator 1 is tuned through from one end to the other a total voltage change Δ V of approx. 500 mV can arise at point M, the maximum display error at the ends of the scale will amount to 5 mV/500 mV = 1 %. Of course this error can be taken into account when the scale is manufactured, i.e., on calibration of the scale. If the capacity tuning diode 2 is replaced, it is of course possible (on account of deviations in the individual diodes) that for a frequency change from 1 MHz to 1.5 MHz the required re-tuning voltage may amount to 6 V, for example, instead of 5 V. This voltage difference of 1 V at diode 2 implies a voltage change of 1 V/1000 = 1 mV at the tap-off point M which would correspond to a display error on the scale of 0.2 percent. This explanation therefore demonstrates that a circuit arrangement in accordance with the invention permits indication of frequency with relatively high precision for receivers with capacity diode tuning, with reasonable expense.

The advantages of a circuit in accordance with the invention are as follows:

1. Justifiable extra costs as compared with tuning circuits employing variable capacitors.
2. Precise frequency display.
3. The problems of temperature compensation as frequently encountered with diode tuning circuits are reduced to a minimum.
4. No stabilized supply voltage is required.

It might also be mentioned that the frequency stability of the circuit is primarily dependent on the temperature compensation of the RC-network and on the voltage drift of the differential amplifier input as a result of temperature changes as well as the temperature behavior of the rectifier diodes. Normal commercial amplifiers of this type are supplied possessing a voltage drift amounting to a maximum of 5 $\mu$V/degree which in this circuit, for example in the medium-wave range, would result in a frequency change amounting to a maximum of 60 cps/degree. This value is also dependent on the HF voltage of the oscillator. The higher the oscillator voltage the greater the frequency stability of this circuit.

To obtain even higher frequency stability and an even higher precision of frequency display, it is advantageous to insert an additional high frequency amplifier (e.g. with a voltage amplification of approximately 20 db) between the oscillator 1 and the RC-network 12.

What I claim is:

1. A circuit arrangement with capacity diode tuning for displaying tuning frequencies comprising a receiver oscillator circuit including a capacity tuning diode, an R-C-network, a pair of rectifiers, a potentiometer resistor, a pointer for indicating the tuning frequency on a tuning scale, and a d.c.-amplifier, said R-C-network consisting of two parallel-connected branches conducted to minus pole, each of said branches being a series connection of a resistor and a capacitor on one side and of a capacitor and a resistor on the other side, the output of said oscillator circuit with said capacity tuning diode being connected electrically via said R-C-network and via said rectifiers, each connected in opposite sense, to both terminals of said potentiometer resistor in such a manner that the connection points of said resistors and said capacitors of said series connections are each connected to one of said rectifiers, the tap of said potentiometer resistor being connected electrically via said dc-amplifier back to said oscillator circuit and further mechanically to said pointer thus enabling adjusting said pointer on the tuning scale and simultaneously said potentiometer tap in accordance with the frequency value of the capacity diode system of said oscillator circuit.

2. A circuit arrangement as claimed in claim 1 wherein said dc-amplifier is constructed as differential amplifier.

* * * * *